US012789505B2

(12) United States Patent

Zeng et al.

(10) Patent No.: US 12,789,505 B2

(45) Date of Patent: Nov. 10, 2026

(54) FLEXIBLE DISPLAY SUBSTRATE AND PREPARATION METHOD THEREFOR, AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Jia Zeng, Beijing (CN); Wei Qing, Beijing (CN); Zhihui Wang, Beijing (CN)

(73) Assignees: Chengdu BOE Optoelectronics Technology Co., Ltd., Chengdu (CN); Beijing BOE Technology Development Co., Ltd., Beijing (CN)

( * ) Notice: Subject to any disclaimer, the term of this patent is extended or adjusted under 35 U.S.C. 154(b) by 571 days.

(21) Appl. No.: 18/270,851

(22) PCT Filed: Oct. 22, 2021

(86) PCT No.: PCT/CN2021/125566

§ 371 (c)(1),
(2) Date: Jul. 4, 2023

(87) PCT Pub. No.: WO2022/188414

PCT Pub. Date: Sep. 15, 2022

(65) Prior Publication Data

US 2024/0066837 A1 Feb. 29, 2024

(30) Foreign Application Priority Data

Mar. 12, 2021 (CN) ........................ 202110270452.1

(51) Int. Cl.

| | |
|---|---|
| ***B32B 15/02*** | (2006.01) |
| ***B32B 3/30*** | (2006.01) |
| ***B32B 7/022*** | (2019.01) |
| ***B32B 7/12*** | (2006.01) |
| ***B32B 15/04*** | (2006.01) |
| ***B32B 15/18*** | (2006.01) |
| ***B32B 37/10*** | (2006.01) |
| ***B32B 37/12*** | (2006.01) |

(Continued)

(52) U.S. Cl.

CPC ................ *B32B 15/02* (2013.01); *B32B 3/30* (2013.01); *B32B 7/022* (2019.01); *B32B 7/12* (2013.01);

(Continued)

(58) Field of Classification Search

CPC ........... B32B 15/02; B32B 7/022; B32B 3/30; B32B 7/12; B32B 15/04; B32B 15/18;

(Continued)

(56) References Cited

U.S. PATENT DOCUMENTS 11,551,594 B2 * 1/2023 Huang .................... G09F 9/301
2013/0265631 A1 10/2013 Ahn et al.

(Continued)

FOREIGN PATENT DOCUMENTS

CN 107578707 A * 1/2018
CN 109256044 A 1/2019

(Continued)

OTHER PUBLICATIONS

CN107578707A Machine Translation (Year: 2017).*

(Continued)

*Primary Examiner* — Travis M Figg

(74) *Attorney, Agent, or Firm* — IPro, PLLC

(57) ABSTRACT

A flexible display substrate and a manufacturing method therefor, and a display device are disclosed. The flexible display substrate includes: a flexible display screen; an elastic layer which is located on one side of the flexible display screen, is connected to the flexible display screen by means of a first adhesive layer, and is in a compressed force storage state; and a material layer which is located on the side of the elastic layer away from the flexible display screen, and has an elastic modulus smaller than that of the first adhesive layer.

13 Claims, 9 Drawing Sheets

(51) Int. Cl.
*H10K 59/80* (2023.01)
*H10K 102/00* (2023.01)

(52) U.S. Cl.
CPC .............. *B32B 15/04* (2013.01); *B32B 15/18* (2013.01); *B32B 37/10* (2013.01); *B32B 37/12* (2013.01); *H10K 59/80* (2023.02); *B32B 2307/50* (2013.01); *B32B 2307/54* (2013.01); *B32B 2307/7376* (2023.05); *B32B 2457/206* (2013.01); *H10K 2102/311* (2023.02)

(58) Field of Classification Search
CPC . B32B 37/10; B32B 37/12; B32B 2307/7376; B32B 2307/50; B32B 2307/54; B32B 2457/206; H10K 59/80; H10K 2102/311
See application file for complete search history.

(56) References Cited

U.S. PATENT DOCUMENTS

2023/0130073 A1* 4/2023 Han ...................... G06F 1/1616 455/575.3
2023/0144564 A1* 5/2023 Lee ..................... H04M 1/0216 428/12
2023/0209971 A1* 6/2023 Wang ..................... H10K 59/80 349/194

FOREIGN PATENT DOCUMENTS

| | | | | | |
|---|---|---|---|---|---|
| CN | 208622359 | U | * | 3/2019 | |
| CN | 208622368 | U | | 3/2019 | |
| CN | 109949702 | A | | 6/2019 | |
| CN | 110428735 | A | * | 11/2019 | ............. G09F 9/301 |
| CN | 111724678 | A | * | 9/2020 | .......... H04M 1/0268 |
| CN | 113053255 | A | | 6/2021 | |
| KR | 1020140091271 | A | | 7/2014 | |

OTHER PUBLICATIONS

CN110428735A Machine Translation (Year: 2019).*
CN208622359U Machine Translation (Year: 2019).*
CN202110270452.1 first office action.
CN202110270452.1 Decision of Rejection.
PCT/CN2021/125566 international search report.

* cited by examiner

FLEXIBLE DISPLAY SUBSTRATE AND PREPARATION METHOD THEREFOR, AND DISPLAY DEVICE

CROSS REFERENCE TO RELATED APPLICATION

The present application is a US National Stage of International Application No. PCT/CN2021/125566, filed on Oct. 22, 2021, which claims priority to Chinese Patent Application No. 202110270452.1, filed with the China National Intellectual Property Administration on Mar. 12, 2021 and entitled "Flexible Display Substrate and Preparation Method therefor, and Display Device", which is hereby incorporated by reference in its entirety.

TECHNICAL FIELD

The present application relates to the technical field of display, and particularly to a flexible display substrate and a manufacturing method therefor, and a display device.

BACKGROUND

A predominant advantage of flexible active-matrix organic light-emitting diode (AMOLED) displays is the ability to be manufactured into foldable display devices. Such devices are highly portable and cutting-edge with an extendable display area in use. At present, a variety of mobile phones with foldable display screens have been available on the market. As for electronic products with foldable screens, the biggest problem lies in screen creases. Especially for infolding products, when a bending radius is small, creases visible to the naked eye are inevitably produced due to deformation of a material itself.

Currently, most methods to solve a crease are to stretch a screen module to a certain extent by an external mechanism, thus making a screen itself produce a certain tension to alleviate the crease. However, the external mechanism may occupy a certain space of an entire machine, which limits the design of the entire machine. Therefore, how to solve the problem of the crease on the foldable screen without occupying the space of the entire machine is a pressing problem for those skilled in the art.

SUMMARY

The present disclosure provides a flexible display substrate and a manufacturing method therefor, and a display device, which can not only alleviate the problem of a crease of a display screen, but also save a space of an entire machine.

In order to achieve the above objective, the present disclosure provides a flexible display substrate. The flexible display substrate includes:

- a flexible display screen;
- an elastic layer located on a side of the flexible display screen, where the elastic layer is connected to the flexible display screen through a first adhesive layer, and the elastic layer is in a compressed force storage state; and
- a material layer located on a side of the elastic layer facing away from the flexible display screen, where an elastic modulus of the material layer is less than an elastic modulus of the first adhesive layer.

According to the flexible display substrate in the present disclosure, the elastic layer is attached to the side of the flexible display screen through the first adhesive layer, the elastic layer is in the compressed force storage state, the material layer is further arranged on the side of the elastic layer facing away from the flexible display substrate, and t an elastic modulus of the material layer is less than an elastic modulus of the first adhesive layer. Since that elastic layer is in the compressed force storage state, that is, stores compressed elastic strain energy, the elastic layer has a tendency of stretching back, such that tension may be applied to an upper adjacent film layer and a lower adjacent film layer. Since an elastic modulus of the first adhesive layer is greater than an elastic modulus of the material layer, resilience applied by the elastic layer to the first adhesive layer may be well transmitted to the flexible display screen, such that a certain tensile force is applied to the screen, the screen is in a tensile state after being unfolded, and a crease is further alleviated. Because the use of an external mechanism to improve the mechanism is avoided, the space of the entire machine may be also saved conveniently.

Thus, according to the flexible display substrate provided in the present disclosure, the elastic layer in the compressed force storage state is attached to a screen module, such that the crease condition of the flexible display screen is alleviated, and the space of the entire machine is also saved.

Optionally, an internal structure of the elastic layer is a mesh structure, the mesh structure includes a plurality of nodes, and an elastic rib is connected between every two adjacent nodes, such that when the elastic layer is compressed, the elastic rib is in a compressed deformation state and stores strain energy.

Optionally, in a bending direction of the flexible display screen, a length of an inner side of the elastic rib is greater than a length of an outer side of the elastic rib.

Optionally, the flexible display substrate further includes a base, and the material layer is located between the base and the elastic layer.

Optionally, the material layer is a second adhesive layer.

Optionally, the flexible display substrate further includes a base, and the flexible display screen is located between the base and the first adhesive layer.

Optionally, the flexible display screen includes a display area and a frame area, and an orthographic projection of the elastic layer on the base is located in an orthographic projection of the frame area on the base.

Optionally, the material layer is a shielding layer, and the shielding layer includes a soft material area uniformly distributed with a bending center of the flexible display screen as a center.

Optionally, a thickness of the elastic layer is in a range of 20 um to 200 um.

Optionally, a material of the elastic layer is stainless steel or titanium alloy.

Optionally, the elastic layer includes a plurality of elastic layers, and for film layers adjacent to each elastic layer of the elastic layers, an elastic modulus of the film layer on a side of the elastic layer facing the flexible display screen is greater than an elastic modulus of the film layer on a side of the elastic layer away from the flexible display screen.

Optionally, the present disclosure further provides a manufacturing method for a flexible display substrate. The manufacturing method includes:

- providing a magnetic plate and a lower pressing plate that are stacked, and placing an elastic layer before compression on a side of the lower pressing plate facing away from the magnetic plate;
- placing an upper pressing plate on a side of the elastic layer facing away from the lower pressing plate;

placing pressing blocks on two sides of the elastic layer, such that the pressing blocks move relative to each other to make the elastic layer in a compressed state;

generating magnetism by the magnetic plate, such that the elastic layer is attached to the lower pressing plate;

removing the upper pressing plate;

attaching a first adhesive layer and a flexible display screen to the side of the elastic layer facing away from the lower pressing plate sequentially; and releasing magnetic force from the magnetic plate.

Optionally, the manufacturing method further includes:

providing a base;

attaching a second adhesive layer to a side of the base; and attaching the elastic layer to which the first adhesive layer and the flexible display screen are attached to a side of the second adhesive layer facing away from the base, where the elastic layer is located between the first adhesive layer and the second adhesive layer, and an elastic modulus of the first adhesive layer is greater than an elastic modulus of the second adhesive layer.

Optionally, the manufacturing method further includes:

providing a base;

attaching the elastic layer to which the first adhesive layer and the flexible display screen are attached to a side of the base, where the flexible display screen is located between the first adhesive layer and the base; and placing a shielding layer on a side of the elastic layer facing away from the first adhesive layer, where an elastic modulus of the shielding layer is less than an elastic modulus of the first adhesive layer.

Optionally, the present disclosure further provides a display device. The display device includes the flexible display substrate according to any one of the above items.

01—magnetic plate; 02—lower pressing plate; 03—upper pressing plate; 04—pressing block; 10—base; 20—flexible display screen; 21—display area; 22—frame area; 30—first adhesive layer; 40—elastic layer; 41—elastic rib; 50—material layer; 51—second adhesive layer; 52—shielding layer; 521—soft material area; and 60—third adhesive layer.

DETAILED DESCRIPTION

Figure 1:
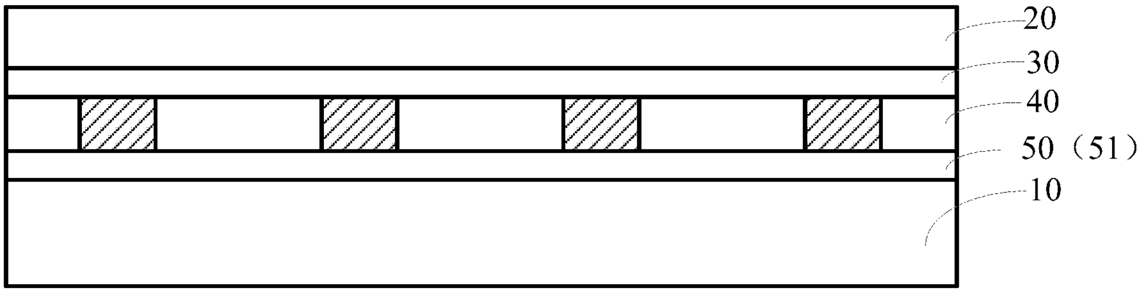
FIG. 1 is a schematic diagram of a sectional structure of a flexible display substrate according to an embodiment of the present application.

With reference to FIG. 1, the present disclosure provides a flexible display substrate, including:

a flexible display screen 20;

an elastic layer 40 located on a side of the flexible display screen 20, where the elastic layer 40 is connected to the flexible display screen 20 through a first adhesive layer 30, and the elastic layer 40 is in a compressed force storage state; and a material layer 50 located on a side of the elastic layer 40 facing away from the flexible display screen 20, where an elastic modulus of the material layer 50 is less than an elastic modulus of the first adhesive layer 30.

According to the above flexible display substrate, the elastic layer 40 is attached to the side of the flexible display screen 20 through the first adhesive layer 30, the elastic layer 40 is in the compressed force storage state, the material layer 50 is further arranged on the side of the elastic layer 40 facing away from the flexible display substrate, and the elastic modulus of the material layer 50 is less than the elastic modulus of the first adhesive layer 30. Since that elastic layer 40 is in the compressed force storage state, that is, stores compressed elastic strain energy, the elastic layer has a tendency of stretching back, such that tension may be applied to an upper adjacent film layer and a lower adjacent film layer. Since the elastic modulus of the first adhesive layer 30 is greater than the elastic modulus of the material layer 50, resilience applied by the elastic layer 40 to the first adhesive layer 30 may be well transmitted to the flexible display screen 20, such that a certain tensile force is applied to the screen, the screen is in a tensile state after being unfolded, and a crease is further alleviated. Because the use of an external mechanism is avoided, the space of the entire machine may be also saved conveniently.

Thus, according to the flexible display substrate provided in the present disclosure, the elastic layer 40 in the compressed force storage state is attached to a screen module, such that the crease condition of the flexible display screen 20 is alleviated, and the space of the entire machine is also saved.

Figure 2A:
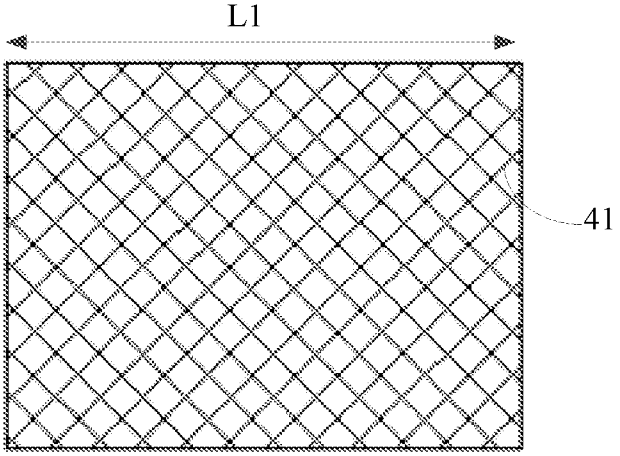
FIG. 2A is a schematic structural diagram of an elastic layer according to an embodiment of the present application.
Figure 2B:
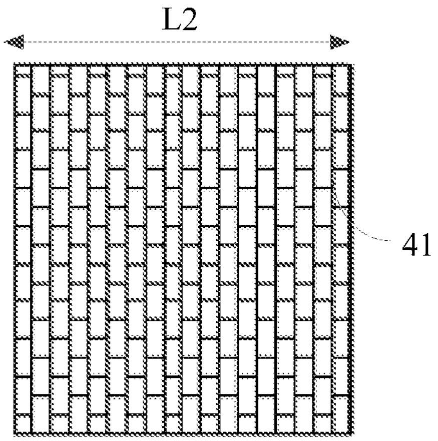
FIG. 2B is a schematic structural diagram of the elastic layer in FIG. 2A after compression.
Figure 3A:
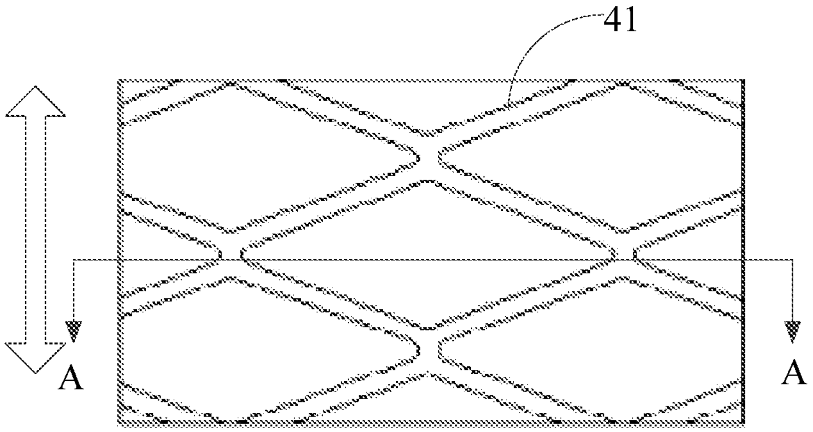
FIG. 3A is a schematic structural diagram of a microscopic pattern of an elastic layer according to an embodiment of the present application.
Figure 3B:
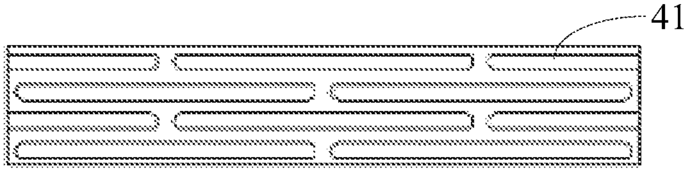
FIG. 3B is a schematic structural diagram of the elastic layer in FIG. 3A after compression.
Figure 4A:
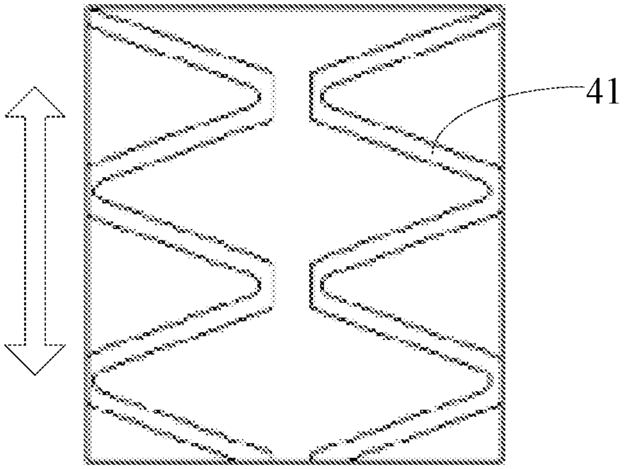
FIG. 4A is a schematic structural diagram of a microscopic pattern of an elastic layer according to an embodiment of the present application.
Figure 4B:
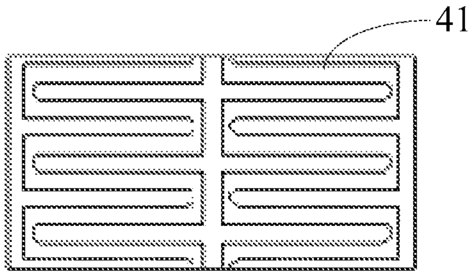
FIG. 4B is a schematic structural diagram of the elastic layer in FIG. 4A after compression.

In some embodiments, as shown in FIG. 2A, 3A, or 4A, an internal structure of the elastic layer 40 is a mesh structure. The mesh structure includes a plurality of nodes, and an elastic rib 41 is connected between every two adjacent nodes, such that when the elastic layer 40 is compressed (with a compression direction being a direction indicated by an arrow in the figure), the elastic rib 41 is in a compressed deformation state and stores strain energy (with reference to FIG. 2B, 3B, or 4B). Since the elastic layer 40 in the present application stores elastic strain energy through elastic deformation of its macrostructure, rather than dissipates the strain energy through deformation of an internal microstructure of the material, the elastic layer 40 can store the strain energy after compression. In the bending process of a compressed pattern, the material is in an elastic deformation range through the macroscopic elastic deformation of the compressed pattern, such that the failure of the material is avoided.

It should be noted that a length and a width of the elastic layer 40 may be determined according to an actual size of a product, which is not limited herein. As shown in FIGS. 2A and 2B, a length of the elastic layer 40 before compression is L1, and a length of the elastic layer after compression is L2, L2 is less than L1, and the elastic layer 40 is in the compressed force storage state in this case.

As an implementation, a thickness of the elastic layer may be in a range of 20 um to 200 um, such a size may not only satisfy requirements of the elastic layer 40 for storing enough elastic strain energy, but also not occupy too much space, so as not to influence the size of the entire machine.

A material of the elastic layer 40 may also be a metal material such as stainless steel or titanium alloy.

Figure 5A:
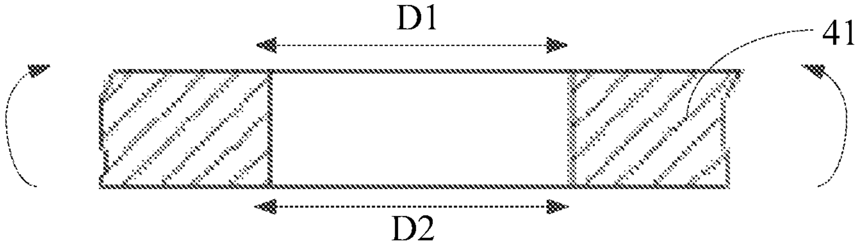
FIGS. 5A-5C are schematic diagrams of different sectional structures in direction A in FIG. 3A respectively.
Figure 5B:
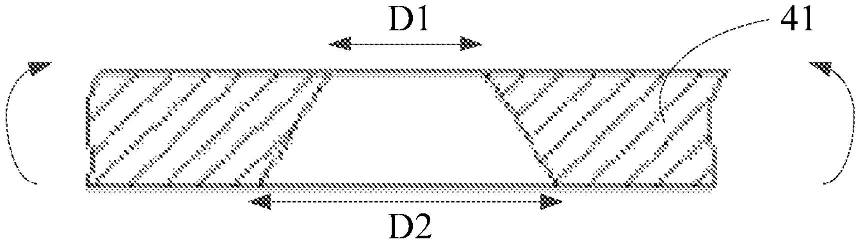
Figure 5C:
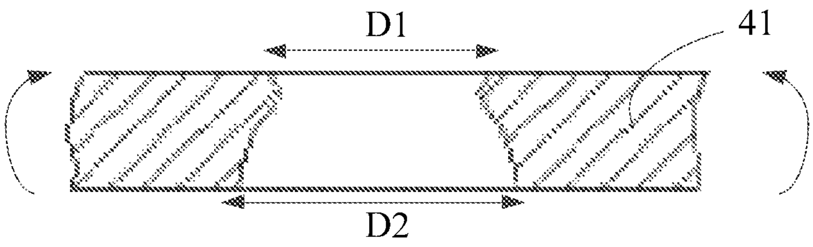

As shown in FIGS. 5A, 5B and 5C which are schematic diagrams of section AA in FIG. 3A, a sectional shape of the elastic layer 40 may be as shown in the figures. In a bending direction (the direction indicated by the arrow in the figure) of the flexible display screen 20, a length of each elastic rib 41 located at an inner side is greater than or equal to a length of the elastic rib 41 located at an outer side. As shown in FIG. 5A, the length of the elastic rib 41 located at the inner side is equal to the length of the elastic rib 41 located at the outer side, such that gaps between two adjacent elastic ribs 41 satisfy D1=D2. As shown in FIGS. 5B and 5C, the inner side and the outer side of the elastic ribs 41 have different lengths, the length of the inner side is greater than the length of the outer side, and therefore, a space between two adjacent elastic ribs 41 forms a substantially trapezoidal structure, that is, D1 at the inner side is less than D2 at the outer side. When the flexible display substrate is bent, external stress may be greater than internal stress. When an internal structure of the elastic layer 40 is as shown in FIG. 5B or 5C, the stress on the outer side may be reduced, so as to reduce the risk of structural failure. It should be noted that with reference to FIG. 1 or 6, the flexible display substrate in the present application is provided with a base 10, the outer side mentioned above is a side of the elastic layer 40 facing the base 10, and the inner side is a side of the elastic layer 40 facing away from the base 10.

It should further be noted that the structure in FIG. 5B may be formed by laser processing, and the structure in FIG. 5C may be formed by double-sided etching, and the internal structure of the elastic layer 40 is the structure in FIG. 5B or 5*c*.

In some embodiments, the flexible display substrate in the present application further includes a base 10. The material layer 50 is located between the base 10 and the elastic layer 40, that is, as shown in FIG. 1, the base 10, the material layer 50, the elastic layer 40, the first adhesive layer 30, and the flexible display screen 20 are stacked in sequence in a thickness direction of the flexible display substrate. Alternatively, the material layer 50 may be a second adhesive layer 51 for fixing the attached elastic layer 40, the first adhesive layer 30 and the flexible display screen 20 to the base 10. Since the base 10 is approximately an undeformable rigid body, and an elastic modulus of the first adhesive layer 30 is greater than an elastic modulus of the second adhesive layer 51, the resilience is well conducted to the topmost flexible display screen 20, and then the screen is in a tensile state after being unfolded.

In the above embodiment, since the flexible display screen 20 is located above the elastic layer 40, the elastic layer 40 may be distributed on an entire surface of the flexible display screen 20 facing the base 10, so as to provide the flexible display screen 20 with a maximum tensile force and better alleviate the crease condition.

Figure 6:
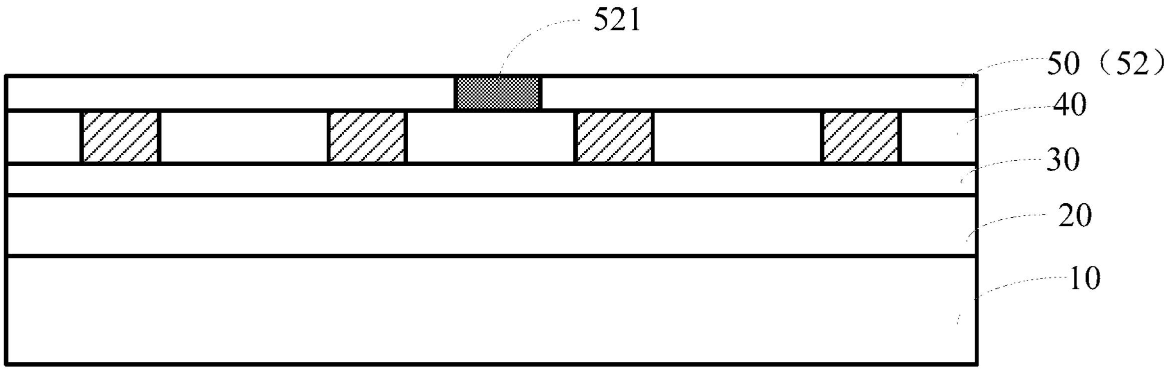
FIG. 6 is a schematic diagram of a sectional structure of a flexible display substrate according to an embodiment of the present application.
Figure 8:
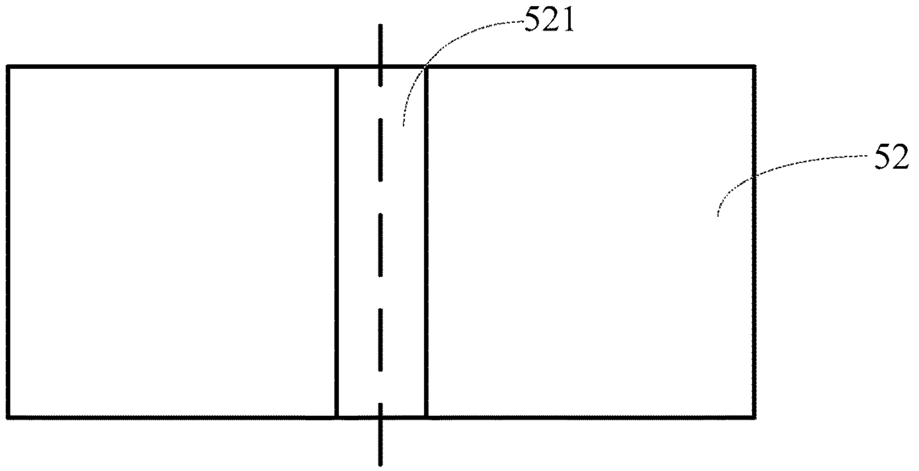
FIG. 8 is a schematic structural diagram of a top view of a shielding layer according to an embodiment of the present application.

In some embodiments, the flexible display substrate of the present application further includes a base 10. The flexible display screen 20 is located between the base 10 and the first adhesive layer 30, that is, as shown in FIGS. 6 and 8, the base 10, the flexible display screen 20, the first adhesive layer 30, the elastic layer 40, and the material layer 50 are stacked in sequence in a thickness direction of the flexible display substrate. Alternatively, the material layer 50 may be a shielding layer 52 for protecting the flexible display substrate. The shielding layer 52 includes a soft material area 521 uniformly distributed along a bending center of the flexible display screen 20, so as to protect a structure of the shielding layer 52 during a plurality of bending processes of the flexible display screen 20.

Figure 7:
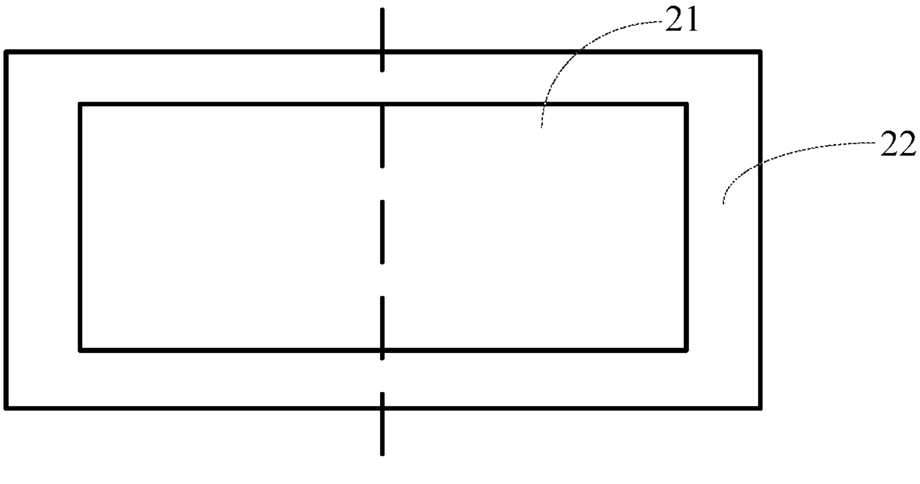
FIG. 7 is a schematic structural diagram of a flexible display screen according to an embodiment of the present application.

In the above embodiment, since the first adhesive layer 30 is located above the flexible display screen 20, in order not to influence a display effect of the flexible display screen 20, as shown in FIG. 7, the flexible display screen 20 includes a display area 21 and a frame area 22. An orthographic projection of the elastic layer 40 on the base 10 is located in an orthographic projection of the frame area 22 on the base 10, that is, the elastic layer 40 is attached to the frame area 22 and is attached to a surface of a cover plate of the flexible display screen 20, and the tension of the elastic layer directly acts on a cover plate area at an edge, such that the effect of alleviating the crease may be achieved.

Figure 9:
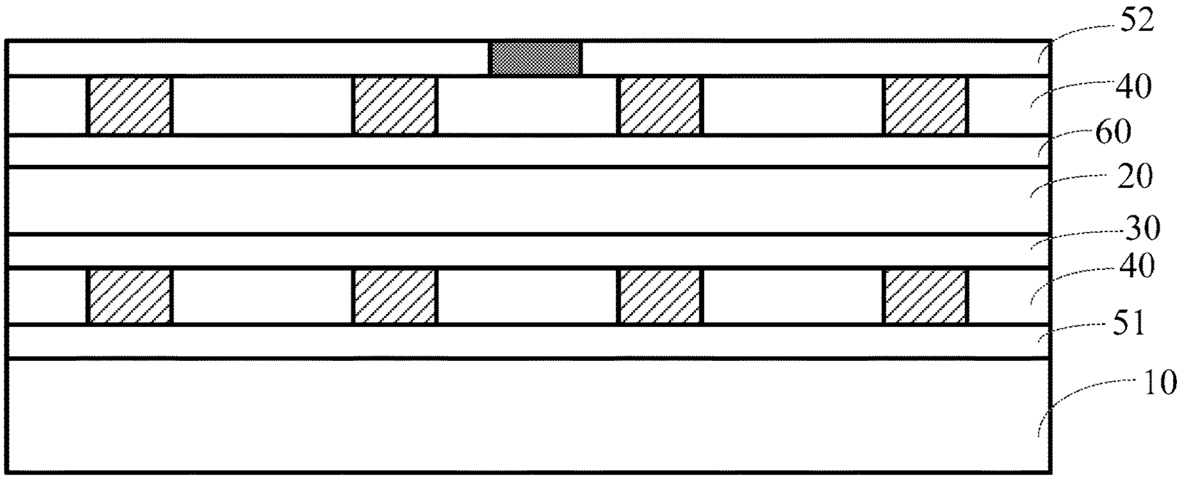
FIG. 9 is a schematic structural diagram of a flexible display substrate according to an embodiment of the present application.

It should be noted that the flexible display substrate in the present application alleviates the crease of the foldable flexible screen by introducing the elastic layer 40. The elastic layer 40 may have one layer or may be an elastic layer composed of a plurality of elastic sub-layers, that is, the number of the elastic layers 40 is not limited to one. For example, as shown in FIG. 9, the flexible display substrate in the present application is provided with the base 10, the second adhesive layer 51, the elastic layer 40, the first adhesive layer 30, the flexible display screen 20, the third adhesive layer 60, the elastic layer 40 and the shielding layer 52 in the thickness direction sequentially. As long as an elastic modulus of the first adhesive layer 30 is greater than an elastic modulus of the second adhesive layer 51, and an elastic modulus of the third adhesive layer 60 is greater than an elastic modulus of the shielding layer 52, the crease may be alleviated.

It should be noted that the above arrangement of two elastic layers 40 is only for illustration. In practical applications, the number and position distribution of the elastic layer 40 can be determined according to different production requirements. In order to achieve the purpose of alleviating the crease, in the upper and lower film layers of each elastic layer 40, an elastic modulus of the film layer closer to the flexible display screen 20 is greater than an elastic modulus of the film layer farther away from the flexible display screen 20, such that the corresponding film layer may well transmit the resilience to the flexible display screen 20.

Based on the same inventive concept, the present application may further provide a display device, including the flexible display substrate as described in any one of the above embodiments. The flexible display substrate alleviates the crease of the foldable flexible screen by introducing the elastic layer 40, the elastic layer 40 is located in a stacked structure of a screen module, and the crease can be eliminated without designing other mechanisms on the entire machine, so as to save space for the entire machine design and facilitate thinning of the display device.

Based on the same inventive concept, the present application further provides a manufacturing method for a flexible display substrate. As shown in FIGS. 10A-10D and 11, the manufacturing method includes following steps.

S101: provide a magnetic plate 01 and a lower pressing plate 02 that are stacked, and place an elastic layer 40 before compression on a side of the lower pressing plate 02 facing away from the magnetic plate 01.

S102: place an upper pressing plate 03 on a side of the elastic layer 40 facing away from the lower pressing plate 02.

S103: place pressing blocks 04 on two sides of the elastic layer 40, such that the two pressing blocks 04 move relative to each other to make the elastic layer 40 in a compressed state.

S104: generate magnetism by the magnetic plate 01, such that the elastic layer 40 is attached to the lower pressing plate 02.

S105: remove the upper pressing plate 03.

S106: attach a first adhesive layer 30 and a flexible display screen 20 to the side of the elastic layer 40 facing away from the lower pressing plate 02 sequentially.

S107: release magnetic force from the magnetic plate 01.

Figure 10A:
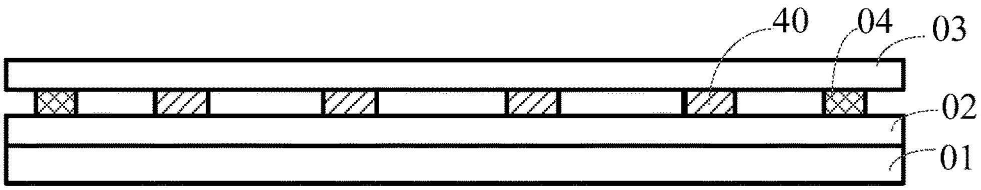
FIGS. 10A-10D are schematic structural diagrams of all stages of a manufacturing method according to an embodiment of the present application.
Figure 10B:
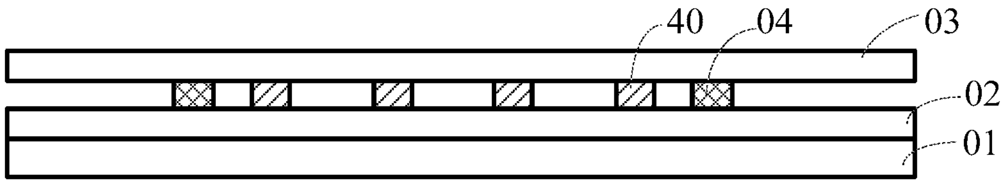
Figure 10C:
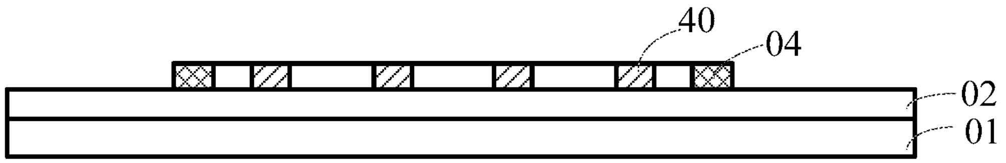
Figure 10D:
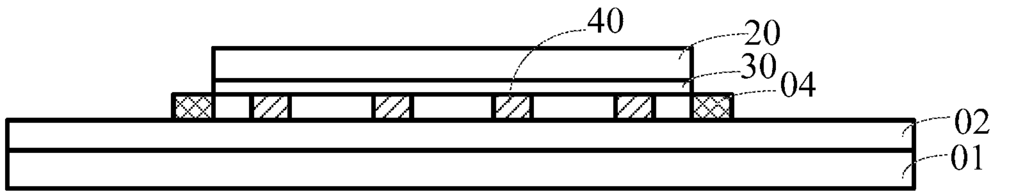
Figure 11:
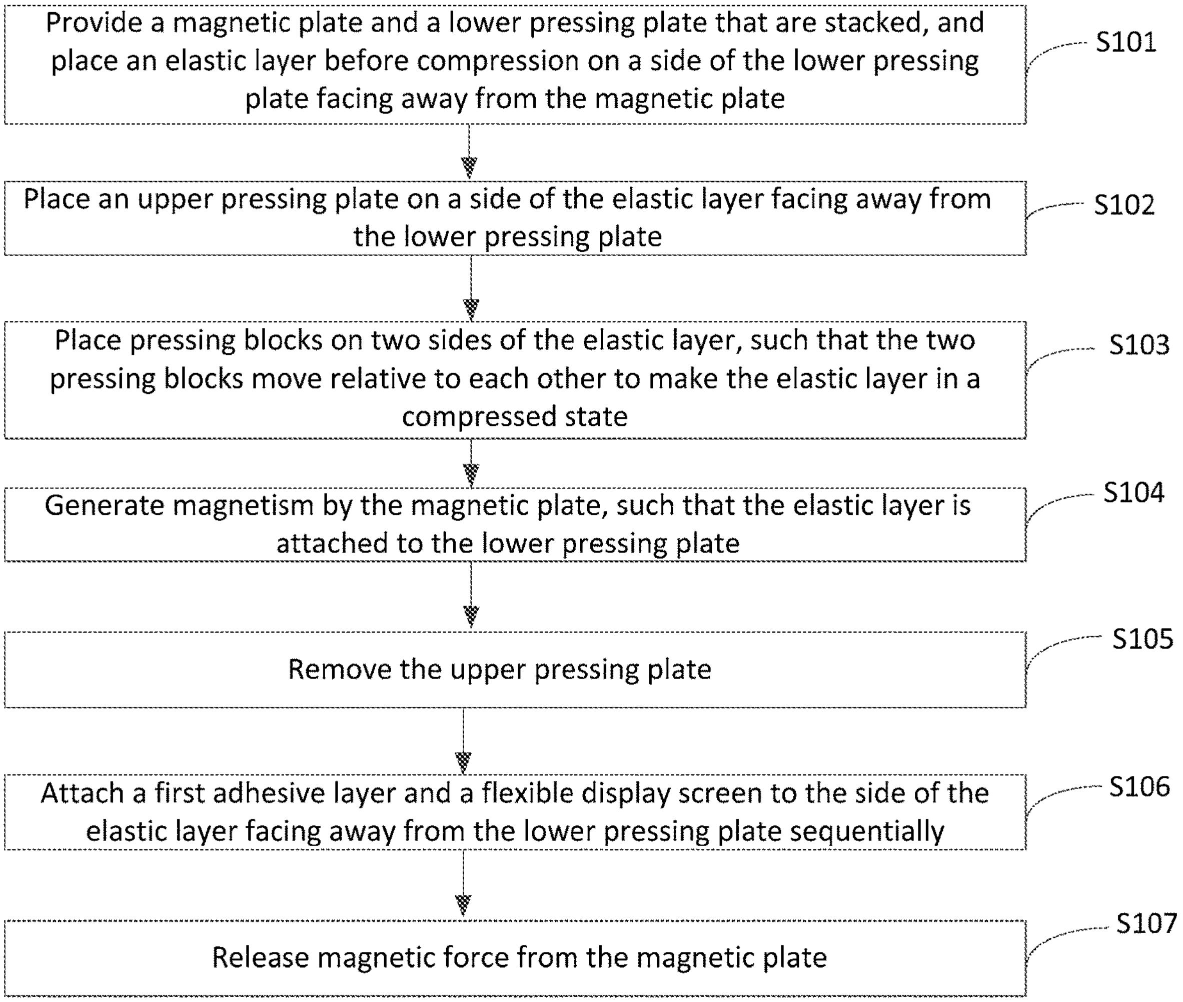
FIG. 11 is a step flowchart of a manufacturing method according to an embodiment of the present application.

In the above manufacturing method, as shown in FIG. 10A, the upper pressing plate 03 is placed on the elastic layer 40, and cooperates with the lower pressing plate 02 to clamp the elastic layer 40, so as to limit displacement of the elastic layer 40 in direction Y. As shown in FIG. 10B, two pressing blocks 04 then move relative to each other to compress the elastic layer 40 in direction X, such that the elastic layer 40 stores elastic strain energy after compression. After the compression is completed, the magnetic plate 01 generates magnetism (the magnetism may be generated by an electromagnet by energizing), so as to attract an elastic body through magnetic force and make the elastic body closely attached to the lower pressing plate 02. As shown in FIG. 10C, after the upper pressing plate 03 is removed, the elastic layer 40 does not bounce under the magnetic force of the magnetic plate 01, but keeps a state of being closely attached to the lower pressing plate 02. As shown in FIG. 10D, the first adhesive layer 30 and the flexible display screen 20 are attached to the elastic layer 40, and after attachment is completed, the magnetic force is released. Since the elastic layer 40 is attached to the flexible display screen 20, the elastic layer does not bounce after the magnetic force disappears, and a certain tension can be provided to the flexible display screen 20.

In the above manufacturing method, the elastic layer 40 is additionally arranged in the screen module, and the manufacturing method is easy to implement, and can well achieve the effect of alleviating the crease of the flexible screen.

Figure 12:
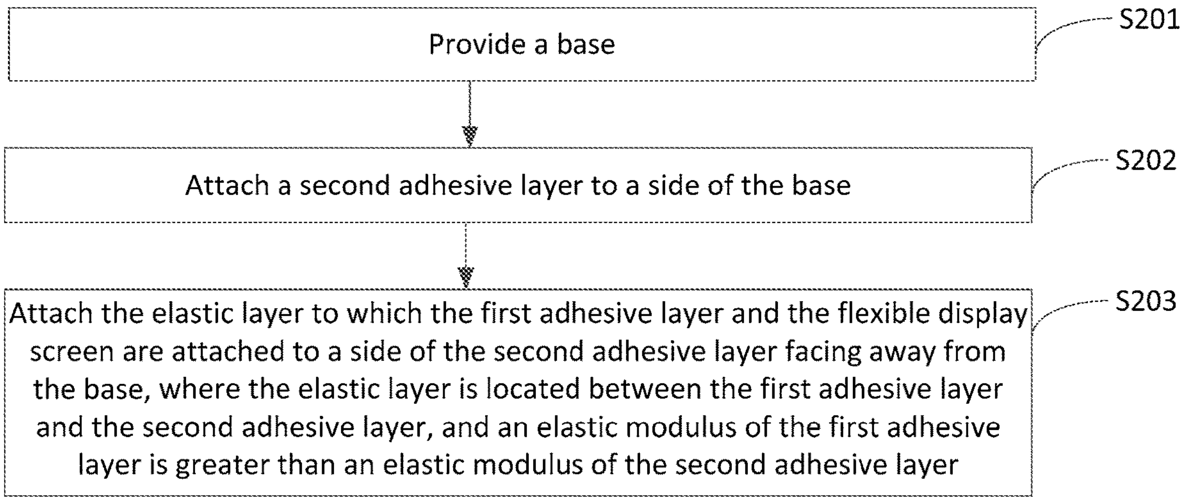
FIG. 12 is a step flowchart of a manufacturing method according to an embodiment of the present application.

Further, with reference to FIGS. 12 and 1, the manufacturing method may further include following steps.

S201: provide a base 10.

S202: attach a second adhesive layer 51 to a side of the base 10.

S203: attach the elastic layer 40 to which the first adhesive layer 30 and the flexible display screen 20 are attached to a side of the second adhesive layer 51 facing away from the base 10, where the elastic layer 40 is located between the first adhesive layer 30 and the second adhesive layer 51, and an elastic modulus of the first adhesive layer 30 is greater than an elastic modulus of the second adhesive layer 51.

In the above manufacturing method, the flexible display screen 20 is placed on the side of the elastic layer 40 facing away from the base 10. Since the base 10 is approximately an undeformable rigid body, and an elastic modulus of the first adhesive layer 30 is greater than an elastic modulus of the second adhesive layer 51, the resilience is well conducted to the topmost flexible display screen 20, and then the screen is in a tensile state after being unfolded.

Figure 13:
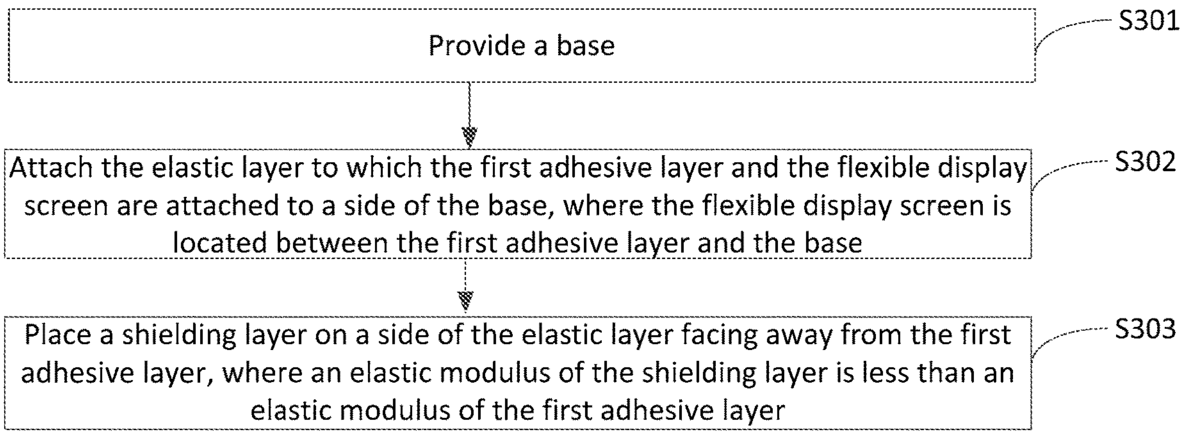
FIG. 13 is a step flowchart of a manufacturing method according to an embodiment of the present application.

Alternatively, with reference to FIGS. 13 and 6, the manufacturing method may further include following steps.

S301: provide a base 10.

S302: attach the elastic layer 40 to which the first adhesive layer 30 and the flexible display screen 20 are attached to a side of the base 10, where the flexible display screen 20 is located between the first adhesive layer 30 and the base 10.

S303: place a shielding layer 52 on a side of the elastic layer 40 facing away from the first adhesive layer 30, where an elastic modulus of the shielding layer 52 is less than an elastic modulus of the first adhesive layer 30.

In the above manufacturing method, since the first adhesive layer 30 is located above the flexible display screen 20, in order not to influence a display effect of the flexible display screen 20, the flexible display screen 20 includes a display area 21 and a frame area 22. An orthographic projection of the elastic layer 40 on the base 10 is located in an orthographic projection of the frame area 22 on the base 10, that is, the elastic layer 40 is attached to the frame area 22 and is attached to a surface of a cover plate of the flexible display screen 20, and the tension of the elastic layer directly acts on a cover plate area at an edge, such that the effect of alleviating the crease may be achieved.

Apparently, those skilled in the art can make various modifications and variations for embodiments of the present disclosure without departing from the spirit and scope of embodiments of the present disclosure. In this way, if the amendments and variations to embodiments of the present disclosure fall within the scope of claims of the present disclosure and its equivalents, it is intended that the present disclosure also include these amendments and variations.

What is claimed is:

1. A flexible display substrate, comprising:

a flexible display screen;

an elastic layer located on a side of the flexible display screen, wherein the elastic layer is connected to the flexible display screen through a first adhesive layer, and the elastic layer is in a compressed force storage state; and a material layer located on a side of the elastic layer facing away from the flexible display screen in a direction perpendicular to a plane where the flexible display screen is located, wherein an elastic modulus of the material layer is less than an elastic modulus of the first adhesive layer;

wherein an internal structure of the elastic layer is a mesh structure, the mesh structure comprises a plurality of nodes, and an elastic rib is connected between every two adjacent nodes, such that when the elastic layer is compressed, the elastic rib is in a compressed deformation state and stores strain energy;

wherein in a bending direction of the flexible display screen, a length of an inner side of the elastic rib is greater than a length of an outer side of the elastic rib.

2. The flexible display substrate according to claim 1, further comprising a base, wherein the material layer is located between the base and the elastic layer.

3. The flexible display substrate according to claim 2, wherein the material layer is a second adhesive layer.

4. The flexible display substrate according to claim 1, further comprising a base, wherein the flexible display screen is located between the base and the first adhesive layer.

5. The flexible display substrate according to claim 4, wherein the flexible display screen comprises a display area and a frame area, and an orthographic projection of the elastic layer on the base is located in an orthographic projection of the frame area on the base.

6. The flexible display substrate according to claim 4, wherein the material layer is a shielding layer, and the shielding layer comprises a flexible material area uniformly distributed with a bending center of the flexible display screen as a center.

7. The flexible display substrate according to claim 1, wherein a thickness of the elastic layer is in a range of 20 um to 200 um.

8. The flexible display substrate according to claim 1, wherein a material of the elastic layer is stainless steel or titanium alloy.

9. The flexible display substrate according to claim 1, wherein the elastic layer comprises a plurality of elastic layers, and for film layers adjacent to each elastic layer of the elastic layers, an elastic modulus of the film layer on a side of the elastic layer facing the flexible display screen is greater than an elastic modulus of the film layer on a side of the elastic layer away from the flexible display screen.

10. A display device, comprising the flexible display substrate according to claim 1.

11. A manufacturing method for the flexible display substrate according to claim 1, comprising:

providing a magnetic plate and a lower pressing plate that are stacked, and placing the elastic layer before compression on a side of the lower pressing plate facing away from the magnetic plate;

placing an upper pressing plate on a side of the elastic layer facing away from the lower pressing plate;

placing pressing blocks on two sides of the elastic layer, such that the pressing blocks move relative to each other to make the elastic layer in a compressed state;

generating magnetism by the magnetic plate, such that the elastic layer is attached to the lower pressing plate;

removing the upper pressing plate;

attaching the first adhesive layer and the flexible display screen to the side of the elastic layer facing away from the lower pressing plate sequentially; and releasing magnetic force from the magnetic plate.

12. The manufacturing method according to claim 11, further comprising:

providing a base;

attaching a second adhesive layer to a side of the base; and attaching the elastic layer to which the first adhesive layer and the flexible display screen are attached to a side of the second adhesive layer facing away from the base, wherein the elastic layer is located between the first adhesive layer and the second adhesive layer, and an elastic modulus of the first adhesive layer is greater than an elastic modulus of the second adhesive layer.

13. The manufacturing method according to claim 11, further comprising:

providing a base;

attaching the elastic layer to which the first adhesive layer and the flexible display screen are attached to a side of the base, wherein the flexible display screen is located between the first adhesive layer and the base; and placing a shielding layer on a side of the elastic layer facing away from the first adhesive layer, wherein an elastic modulus of the shielding layer is less than an elastic modulus of the first adhesive layer.

* * * * *